United States Patent [19]

Gates et al.

[11] 4,209,375
[45] Jun. 24, 1980

[54] SPUTTER TARGET

[75] Inventors: Willard G. Gates, Kansas City, Mo.; Gerald J. Hale, Overland Park, Kans.

[73] Assignee: The United States of America as represented by the United States Department of Energy, Washington, D.C.

[21] Appl. No.: 63,008

[22] Filed: Aug. 2, 1979

[51] Int. Cl.² .............................................. C23C 15/00
[52] U.S. Cl. ............................ 204/192 R; 204/192 C; 204/298; 428/627; 428/662; 428/672; 428/925; 428/926
[58] Field of Search ......... 204/192 R, 192 C, 192 SP, 204/298; 428/621, 627, 632, 662, 670, 672, 925, 926

[56] References Cited

U.S. PATENT DOCUMENTS

| 3,160,480 | 12/1964 | Alliegro | 428/627 |
| 3,487,536 | 1/1970 | Goldstein | 428/662 X |
| 3,802,078 | 4/1974 | Denes | 30/350 |

OTHER PUBLICATIONS

J. van Esdonk and J. F. M. Janssen, Joining a Sputtering Target and a Backing Plate, *Research/Development* vol. 26, No. 1 (Jan., 1975) pp. 41–44.

Primary Examiner—John H. Mack
Assistant Examiner—William Leader
Attorney, Agent, or Firm—R. V. Lupo; Dudley W. King; Robert Southworth, III

[57] ABSTRACT

The disclosure relates to an improved sputter target for use in the deposition of hard coatings. An exemplary target is given wherein titanium diboride is brazed to a tantalum backing plate using a gold-palladium-nickel braze alloy.

8 Claims, 1 Drawing Figure

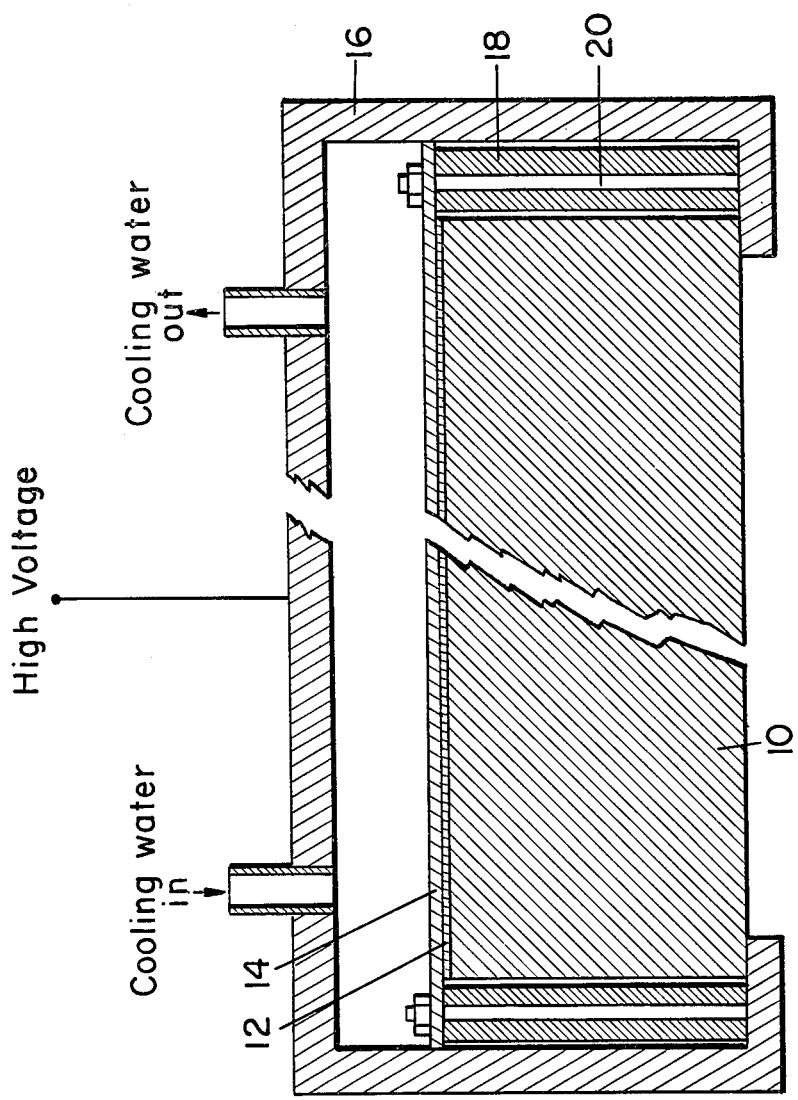

SPUTTER TARGET

FIELD OF THE INVENTION

The invention relates to bonded sputter targets.

BACKGROUND OF THE INVENTION

It is often desired to provide a thin, wear-resistant coating on a base metal to protect the base metal in an abrasive environment. One such proposed hard coating is titanium diboride (U.S. Pat. No. 3,802,078).

A convenient technique for applying thin wear-resistant coatings is to sputter the hard material from a target onto the base metal. Sputtering is a well known technique whereby materials are dislodged from a target or cathode using an electrical glow discharge.

The use of hard materials such as titanium diboride in these targets has presented a problem in that hard materials are frequently brittle and may crack and fail under thermal stress. Conventional sputter targets may employ target material mechanically clamped in a holder, adhesively bonded to a backing plate, or soft-soldered to a copper backing plate. In use, these conventional targets have frequently failed due to thermal stresses in the sputterable material or a thermal expansion mismatch between the sputterable material and its backing plate. The sputtering operation would then be terminated for replacement of the prematurely failed target.

SUMMARY OF THE INVENTION

In view of the difficulties and disadvantages as noted above, it is an object of this invention to provide a novel sputter target.

It is a further object of this invention to provide a sputter target for sputtering hard, brittle materials.

It is a still further object of this invention to provide a titanium diboride sputter target of improved durability.

The invention comprises an improved sputter target having a hard, brittle superstrate brazed to a matched thermal expansion metal substrate using a noble metal braze alloy.

BRIEF DESCRIPTION OF THE DRAWING

Other objects and advantages will be apparent to those skilled in the art from the following description with reference to the appended claims and wherein:

The FIGURE illustrates in cross-section an exemplary embodiment of the invention held in a sputter cathode.

DESCRIPTION OF THE PREFERRED EMBODIMENT

Turning now to the FIGURE, the sputtering target is shown in cross-section. As shown, the sputter target comprises a top layer 10 or superstrate of sputterable material and a base layer 14 or substrate of metal. Bonding layers 10 and 14 together is a thin layer 12 of a high temperature braze material.

The invention is particularly adapted for use with a top layer of a hard, brittle substance such as titanium diboride.

This material has a Vickers microhardness of 3600 kg/mm$^2$ which makes it potentially useful for coating cutting tools. Other useful materials generally include metal oxides, carbides, silicides, borides, and nitrides. Specific examples of these materials are listed in the following table.

TABLE I

| Material |
| --- |
| Aluminum Nitride, AlN |
| Aluminum Oxide, Al$_2$O$_3$ |
| |
| Boron, B |
| Boron Carbide, B$_4$C |
| Boron Nitride, BN |
| |
| Chromium Carbide, Cr$_3$C$_2$, Cr$_7$C$_3$ |
| Chromium Oxide, Cr$_2$O$_3$ |
| Chromium Silicide, Cr$_3$S$_2$ |
| |
| Hafnium Boride, HfB$_2$ |
| Hafnium Carbide, HfC |
| Hafnium Oxide, HfO$_2$ |
| |
| Molybdenum Carbide, Mo$_2$C |
| Molybdenum Silicide, MoSi$_2$ |
| |
| Silicon Carbide, SiC |
| Silicon Nitride, Si$_3$N$_4$ |
| Silicon Oxide, SiO, SiO$_2$ |
| |
| Tantalum Boride, TaB$_2$ |
| Tantalum Carbide, TaC |
| Tantalum Nitride, TaN |
| Tantalum Pentoxide, Ta$_2$O$_5$ |
| Titanium Carbide, TiC |
| Titanium Diboride, TiB$_2$ |
| Titanium Nitride, TiN |
| Titanium Dioxide, TiO$_2$ |
| Tungsten Boride, W$_2$B$_5$, W$_2$B, WB |
| Tungsten Carbide, WC, W$_2$C |
| |
| Vanadium Carbide, VC |
| |
| Zirconium Boride, ZrB$_2$, ZrB$_{12}$ |
| Zirconium Oxide, ZrO$_2$ |

It has been found that about a 0.25 inch thick titanium diboride layer will perform satisfactorily in a sputter target constructed according to the present invention. It will be understood that the term "about" is intended to indicate a tolerance of ±50%.

The base layer 14 serves to hold and support top layer 10. It has been found that the material of the base layer should have a thermal expansivity about that of the top layer. As titanium diboride has a thermal expansivity of about $8.4 \times 10^{-6}$ °C.$^{-1}$ and tantalum has a thermal expansivity of $7.3 \times 10^{-6}$ °C.$^{-1}$, these two materials are sufficiently matched for satisfactory use with the present invention. Tantalum has the further advantage that, as a refractory metal with both it and its oxide having high melting points and extremely low vapor pressures, it is unlikely to contaminate the sputtered coating. Those skilled in the art will recognize that other metals which also have similar expansivities may be satisfactory (such as Kovar with a thermal expansivity of about $9.1 \times 10^{-6}$ °C.$^{-1}$).

It has been found that the employment of a layer 14 that is relatively thin in comparison to layer 10 serves to minimize stresses in layer 10 from any remaining differences in expansion of the two layers. For a 0.25 inch layer of titanium diboride, a 0.015 inch layer of tantalum has been found to be satisfactory (a ratio of 0.06). This thickness of tantalum was further found to minimize the loss of magnetic intensities on the surface of the target to support the glow discharge phenomenon of the sputter deposition process.

The intermediate layer 12 serves to firmly bond layers 10 and 14 together and to provide good thermal contact between the two. It has been found that during sputtering, localized areas of the target may experience temperatures as high as 700° C. Prior art bonding agents such as silver-filled epoxy or soft solders containing tin-lead or tin-silver generally fail under these extreme conditions. It has been found that a noble metal braze alloy with a melting point above 700° C. and preferably above 1000° C. gives superior results. Although the particular alloy chosen may vary with the materials of the first two layers, an alloy comprising 70% gold, 8% palladium, and 22% nickel has been found to be optimum for the titanium diboride/tantalum system. A bonding layer only 0.006 thick or 0.02 of that of the titanium diboride, has been found to be sufficient to produce a firm metallurgical bond between the layers.

As further shown in the FIGURE, the sputter target may be held in a sputter cathode assembly which might include a housing 16, spacing means 18, and fastening means 20 for retaining the target within the housing. Appropriate provisions may be made in the housing for the circulation of cooling water and the passage of a high-voltage electrical current.

EXAMPLE

A 0.015 inch thin sheet of tantalum was degreased with trichloroethylene and placed in a vacuum furnace. Three sheets of 0.002 inch braze alloy were similarly degreased and placed upon the tantalum sheet. The braze alloy was 70% gold, 8% palladium, and 22% nickel having a melting range of 1005° to 1037° C. A hot-pressed square piece of titanium diboride about 5½ inches on a side and 0.25 inch thick was placed upon the braze alloy. The target material was then weighted down with a 7 Kg weight.

The furnace was evacuated to $2 \times 10^{-5}$ Torr and then heated to 1000° C. at a rate of 400° C. per hour. After a 15 minute soak at 1000° C., the furnace was rapidly heated to 1100° C., held at this temperature for 7½ minutes, and then furnace cooled to room temperature.

The bonded target assembly was subsequently employed in a planar magnetron sputtering system. Here, using a voltage of 500 volts and a current of 3 amps, the titanium diboride target material is bombarded with ionized argon under a pressure of about 10 microns (actually a vacuum) to eject this material from the target and deposit it on the surface of tool steel. In producing 0.6 to 0.7 mil coatings the target was found to be resistant to failure by cracking and spalling and to have a useful life of 50 to 75 times that of unbacked targets.

The various features and advantages of the above invention are thought to be clear from the foregoing description. However, various other features and advantages not specifically enumerated will undoubtedly occur to those versed in the art, as likewise will many variations and modifications of the preferred embodiment illustrated, all of which may be achieved without departing from the spirit and scope of the invention as defined in the following claims.

We claim:

1. A vacuum sputter deposition process for depositing material from a sputter target onto a substrate at temperatures as high as 700° C. comprising: (1) forming said target comprising a layer of sputterable material having thickness T and a thermal expansivity A; a metal layer having a thickness about 0.06 T and a thermal expansivity about A; and a metallic layer intermediate and metallurgically bonded to said sputterable layer and said metal layer and having a melting point greater than 700° C. and a thickness about 0.02T; and (2) sputtering said layer of sputterable material.

2. The process of claim 1 wherein the sputterable material is a metal oxide, carbide, silicide, boride, or nitride.

3. The process of claim 1 wherein the sputterable material is selected from Table I.

4. The process of claim 1 wherein T is about 0.25 inch and A is about $8 \times 10^{-6}$ °C.$^{-1}$.

5. The process of claim 1 wherein the intermediate metallic layer is a noble metal alloy with a melting point above 1000° C.

6. The process of claim 1 wherein the metal layer is tantalum.

7. A spall-resistant sputter target for use in vacuum sputter deposition at temperatures as high at 700° C. comprising: a sputterable layer of titanium diboride, a support layer of tantalum, a layer of an alloy comprising 70% gold, 8% palladium, and 22% nickel intermediate and metallurgically bonding together said first and second layers.

8. The sputter target of claim 7 wherein the sputterable layer has a thickness of about 0.25 inch, the support layer has a thickness of about 0.015 inch, and the intermediate bonding layer has a thickness of about 0.006 inch.

* * * * *